(12) United States Patent  
Mohamadi (10) Patent No.: US 8,102,329 B2
(45) Date of Patent: *Jan. 24, 2012

(54) ELECTRONICALLY SCANNED ARRAY HAVING A TRANSMISSION LINE DISTRIBUTED OSCILLATOR AND SWITCH-MODE AMPLIFIER

(75) Inventor: Farrokh Mohamadi, Irvine, CA (US)

(73) Assignee: Farrokh Mohamadi, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/975,323

(22) Filed: Dec. 21, 2010

(65) Prior Publication Data

US 2011/0090133 A1   Apr. 21, 2011

Related U.S. Application Data

(60) Division of application No. 11/622,813, filed on Jan. 12, 2007, now Pat. No. 7,855,695, which is a continuation-in-part of application No. 11/536,625, filed on Sep. 28, 2006, now Pat. No. 7,791,556.

(51) Int. Cl.
*H01Q 1/50* (2006.01)
*H01Q 21/00* (2006.01)
(52) U.S. Cl. ............... 343/850; 343/700 MS; 343/853; 343/824; 343/825
(58) Field of Classification Search .................. None
See application file for complete search history.

(56) References Cited

U.S. PATENT DOCUMENTS

| | | | |
|---|---|---|---|
| 6,377,217 B1 | 4/2002 | Zhu et al. | |
| 6,828,556 B2 | 12/2004 | Pobanz et al. | |
| 6,870,503 B2 | 3/2005 | Mohamadi | |
| 6,885,344 B2 | 4/2005 | Mohamadi | |
| 6,963,307 B2 | 11/2005 | Mohamadi | |
| 6,982,670 B2 | 1/2006 | Mohamadi | |
| 7,286,804 B2 | 10/2007 | Miyagi et al. | |
| 7,312,763 B2 | 12/2007 | Mohamadi | |
| 7,321,339 B2 | 1/2008 | Mohamadi | |
| 7,542,005 B2* | 6/2009 | Mohamadi | 343/853 |
| 7,855,695 B2* | 12/2010 | Mohamadi | 343/850 |
| 7,884,776 B2* | 2/2011 | Mohamadi | 343/853 |
| 2007/0018903 A1 | 1/2007 | Mohamadi | |
| 2007/0146207 A1 | 6/2007 | Mohamadi | |
| 2007/0194991 A1 | 8/2007 | Mohamadi | |
| 2007/0290930 A1 | 12/2007 | Krishnaswamy et al. | |
| 2008/0079636 A1 | 4/2008 | Mohamadi | |
| 2008/0252546 A1 | 10/2008 | Mohamadi | |
| 2008/0297414 A1 | 12/2008 | Krishnaswamy et al. | |

OTHER PUBLICATIONS

S. Bassagni, I. Chalamatac, V. Syrotuk, and B. Woodward, "A distance routing effect algorithm for mobility (DREAM)," Proc. Mobicom1998, Dallas, TX, pp. 76-84, Oct. 1998.

(Continued)

*Primary Examiner* — Trinh Dinh
(74) *Attorney, Agent, or Firm* — Haynes and Boone, LLP (57) ABSTRACT

In one embodiment, an integrated circuit antenna array is provided that includes: a low-voltage substrate supporting an RF transmission network, and a high-voltage substrate bonded to the low-voltage substrate, the high-voltage substrate supporting a plurality of antennas coupled to the RF transmission network through switch-mode power amplifiers integrated into a surface of the high voltage substrate.

7 Claims, 7 Drawing Sheets

OTHER PUBLICATIONS

J Liu,.et al.,"A dual-space, approach to tracking and sensor management in wireless sensor networks," Proc. of the 1th ACM Intl. Workshop on Wireless Sensors Networks, Palo Alto Research Center Technical Report P2002-10077, Mar. 2002.

R. Pasand, et al., "The Capacity of Asynchronous M-ary Time Hopping PPM UWB Mutiple Access Communication Systems," IEEE, pp. 4745-4749, 2004.

N. August, et al., "An Adaptive UWB Modulation Scheme for Optimization of Energy, BER, and Data Rate," TM3-2, IEEE, pp. 182-186, 2004.

F. Mohamadi, A proposed completely electronically controlled beamforming technology for coverage enhancement, IEEE P802.15 Working Group, Mar. 2005, Atlanta, GA.

C. Goldsmith, T.H. Lin, B. Powers, W.R. Wu, and B. Norvell, "Micromechanical Membrane Switches for Microwave Applications," 1995 IEEE MTT-S Dig., 91-94.

A. Malczewski, et al., "X-band RF MEMS Phase Shifters for Phased Array Applications," IEEE Microwave and Guided Wave Letters, vol. 9 , 517-519, Dec. 1999.

J. Hayden and G. Rebeiz, "Very Low-Loss Distributed X-Band and Ka-band MEMS Phase Shifters Using Meta-Air-Metal Capacitors" IEEE, vol. 51, No. 1, Jan. 2003.

F. Mohamadi, "Wafer Scale Integration of Active Antenna Array," RF Design, Feb. 2005, pp. 48-64.

F. Mohamadi, "Si integration with millimeter wave phased array antenna," RF Design, Feb. 2004, pp. 40-48.

F. Mohamadi, "Critical Data Timing in Distributed Systems," Defense Electronics, May 2004, pp. 13-18.

Kleveland, B, et al. "Exploiting CMOS Reverse Interconnect Scaling in Multigigahertz Amplifier and Oscillator Design," IEEE Journal of Solid-State Circuits, 1480-1488, Oct. 2001.

T. Shibata, et al., Characterization of MIS structure coplanar transmission lines for investigation of signal propagation in integrated circuits,IEEE, vol. 38, No. 7,1990,p. 881-890.

A. Zolfaghari, B. Razavi, A Low-Power 2.4 GHz Transmitter/Receiver CMOS IC, IEEE Journal of Solid-State Circuits, Feb. 2003, pp. 176-183, vol. 38 No. 2.

* cited by examiner

ELECTRONICALLY SCANNED ARRAY HAVING A TRANSMISSION LINE DISTRIBUTED OSCILLATOR AND SWITCH-MODE AMPLIFIER

RELATED APPLICATION

This application is a divisional of U.S. application Ser. No. 11/622,813, filed Jan. 12, 2007, now U.S. Pat. No. 7,855,695, which in turn is a continuation-in-part of U.S. application Ser. No. 11/536,625, filed Sept. 28, 2006, now U.S. Pat. No. 7,791,556.

TECHNICAL FIELD

The present invention relates generally to integrated circuits, and more particularly to an integrated beamforming array.

BACKGROUND

Conventional beamforming systems are often cumbersome to manufacture. In particular, conventional beamforming antenna arrays require complicated feed structures and phase-shifters that are impractical to be implemented in a semiconductor-based design due to its cost, power consumption and deficiency in electrical characteristics such as insertion loss and quantization noise levels. In addition, such beamforming arrays make digital signal processing techniques cumbersome as the operating frequency is increased. In addition, at the higher data rates enabled by high frequency operation, multipath fading and cross-interference becomes a serious issue. Adaptive beamforming techniques are known to combat these problems. But adaptive beamforming for transmission at 10 GHz or higher frequencies requires massively parallel utilization of A/D and D/A converters.

To provide a beamforming system compatible with semiconductor processes, the applicant has provided a number of integrated antenna architectures. For example, U.S. application Ser. No. 11/454,915, the contents of which are incorporated by reference, discloses a beamforming system in which an RF signal is distributed through a transmission network to integrated antenna circuits that include a beamforming circuit that adjusts the phase and/or the amplitude of distributed RF signal responsive to control from a controller/phase manager circuit. In a receive configuration, each beamforming circuit adjusts the phase and/or the amplitude of a received RF signal from the corresponding integrated circuit's antenna and provide the resulting adjusted received RF signal to the transmission network. Although such integrated antenna circuits consume a relatively small amount of power, transmission loss is incurred through the resulting RF propagation in the transmission network. To account for such loss, U.S. application Ser. No. 11/454,915 discloses a distributed amplification system such that RF signals propagated through the transmission network are actually amplified rather than attenuated. However, the transmission network introduces dispersion as well.

To avoid the dispersion introduced by an RF transmission network, an alternative integrated circuit (which may also be denoted as an integrated oscillator circuit) has been developed such as disclosed in U.S. Pat. No. 6,982,670. For example, each integrated oscillator/antenna circuit may include an oscillator such as a phase-locked loop (PLL) and a corresponding antenna and mixer. In such an embodiment, each PLL is operable to receive a reference signal and provide a frequency-shifted signal output signal that is synchronous with the reference signal. Should an integrated oscillator/ antenna circuit be configured for transmission, its output signal is upconverted in the unit's mixer and the upconverted signal transmitted by the corresponding antenna. Alternatively, should an integrated oscillator/antenna circuit be configured for reception, a received RF signal from the unit's antenna is downconverted in the mixer responsive to the frequency-shifted output signal from the PLL. Although the integrated oscillator circuit approach does not have the dispersion issues resulting from propagation through a transmission network, the inclusion of an oscillator in each integrated oscillator circuit demands significantly more power than the transmission network approach.

To avoid the dispersion resulting from propagation through a transmission network or the expense of an integrated oscillator approach, a distributed oscillator architecture has been developed as disclosed in U.S. application Ser. No. 11/536,625. In this architecture, a resonant transmission network with distributed amplification is driven by a triggering pulse waveform such that the entire transmission network oscillates acting as a distributed oscillator. In this fashion, high frequency RF signals and/or narrowband pulses from the resonant transmission signal are coupled a globally synchronized fashion to the various integrated antennas. Each antenna (or a subset of antennas) may include a phase-shifter and/or attenuator to provide beamforming capabilities. Although this resonant approach is compatible with conventional semiconductor processes, the smaller dimensions of modern semiconductor processes are not compatible with large voltages. For example, it is conventional in certain CMOS processes to limit signal voltages to 2.5 V or even 1.5V or less. Voltages in excess of these limits may damage the devices or cause long-term reliability issues adversely impacting their performance. This limit on voltage places a limit on the amount of transmit power that can be delivered to the antennas. In addition, it may be desirable that the resonant oscillation amplitude over the resonant transmission network be maximized. Accordingly, there is a need in the art for integrated solutions compatible with high power operation. Moreover, there is a need in the art for a resonant transmission network that has an enhanced oscillation amplitude.

SUMMARY

In accordance with an embodiment of the invention, an integrated circuit antenna array is provided that includes: a low-voltage substrate supporting an RF transmission network, and a high-voltage substrate bonded to the low-voltage substrate, the high-voltage substrate supporting a plurality of antennas coupled to the RF transmission network through switch-mode power amplifiers integrated into a surface of the high voltage substrate.

The invention will be more fully understood upon consideration of the following detailed description, taken together with the accompanying drawings.

BRIEF DESCRIPTION OF THE DRAWINGS

FIG. 6b is a schematic illustration for an alternative embodiment of the distributed amplifier of FIG. 6a.

Embodiments of the present invention and their advantages are best understood by referring to the detailed description that follows. It should be appreciated that like reference numerals are used to identify like elements illustrated in one or more of the figures.

DETAILED DESCRIPTION

Reference will now be made in detail to one or more embodiments of the invention. While the invention will be described with respect to these embodiments, it should be understood that the invention is not limited to any particular embodiment. On the contrary, the invention includes alternatives, modifications, and equivalents as may come within the spirit and scope of the appended claims. Furthermore, in the following description, numerous specific details are set forth to provide a thorough understanding of the invention. The invention may be practiced without some or all of these specific details. In other instances, well-known structures and principles of operation have not been described in detail to avoid obscuring the invention.

Figure 1:
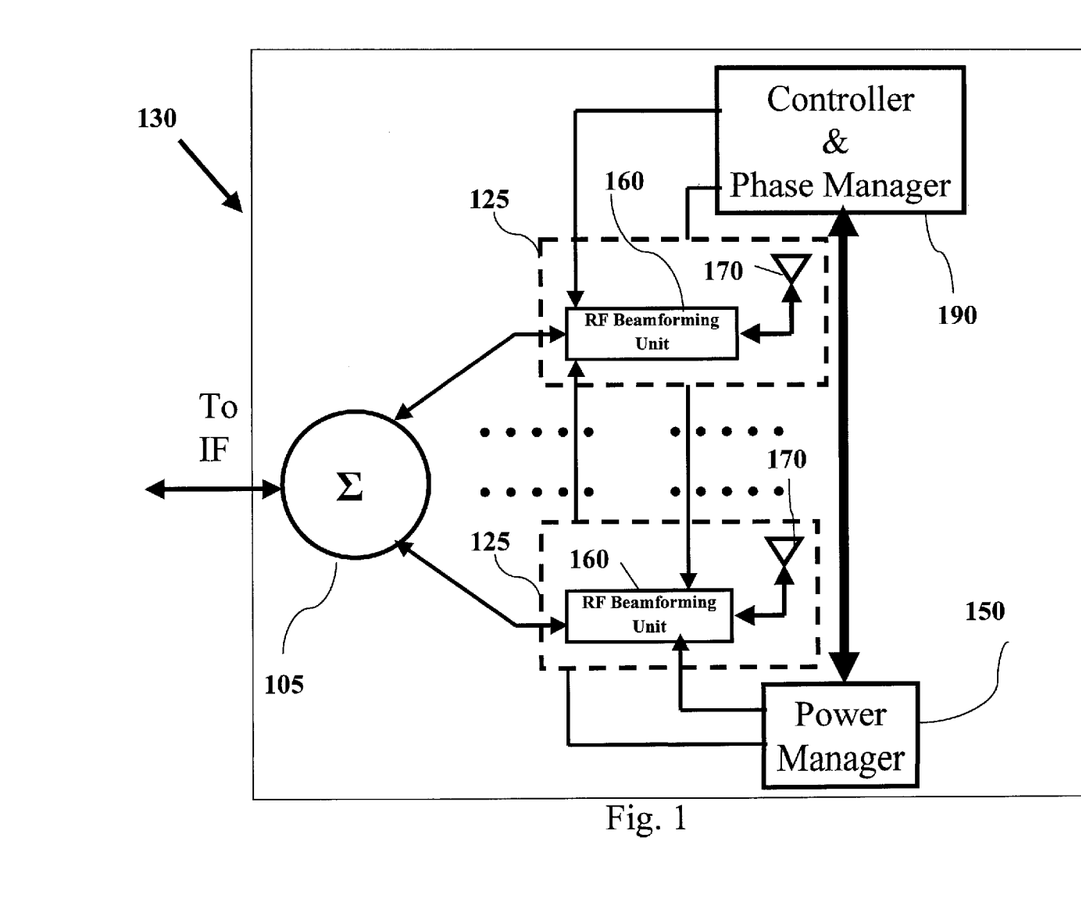
FIG. 1 is a block diagram of a beamforming antenna array in which the beamforming is performed in the RF domain.

As discussed previously, an integrated circuit beamforming array may be constructed using a transmission network that distributes an RF signal to and from a plurality of antennas. In some embodiments, the semiconductor substrate may comprise a wafer such that the resulting integrated circuit may be denoted as a wafer scale antenna module (WSAM). The transmission network may include distributed amplifiers such as those discussed in U.S. application Ser. No. 11/454,915. In some distributed amplifier embodiments, an RF signal is driven into an input port for the transmission network, amplified through the distributed amplifiers coupled to the transmission network, and distributed through the transmission network to the plurality of integrated antennas. An exemplary embodiment is illustrated in FIG. 1, which illustrates an integrated RF beamforming and controller unit 130. The transmission network with distributed amplification is conceptually illustrated by an adder 105, which may receive an RF signal from an intermediate frequency (IF) stage (not illustrated). Alternatively, a direct downconversion architecture may be implemented. In the illustrated embodiment, the receive and transmit antenna arrays are the same such that each antenna 170 functions to both transmit and receive. A plurality of integrated antenna circuits 125 coupled to the transmission network each includes an RF beamforming interface circuit 160 and receive/transmit antenna 170. RF beamforming interface circuit 160 adjusts the phase and/or the amplitude of the received and transmitted RF signal responsive to a control signal from a controller/phase manager circuit 190. Although illustrated having a one-to-one relationship between beamforming interface circuits 160 and antennas 170, it will be appreciated, however, that an integrated antenna circuit 125 may include a plurality of antennas all driven by RF beamforming interface circuit 160.

Figure 2:
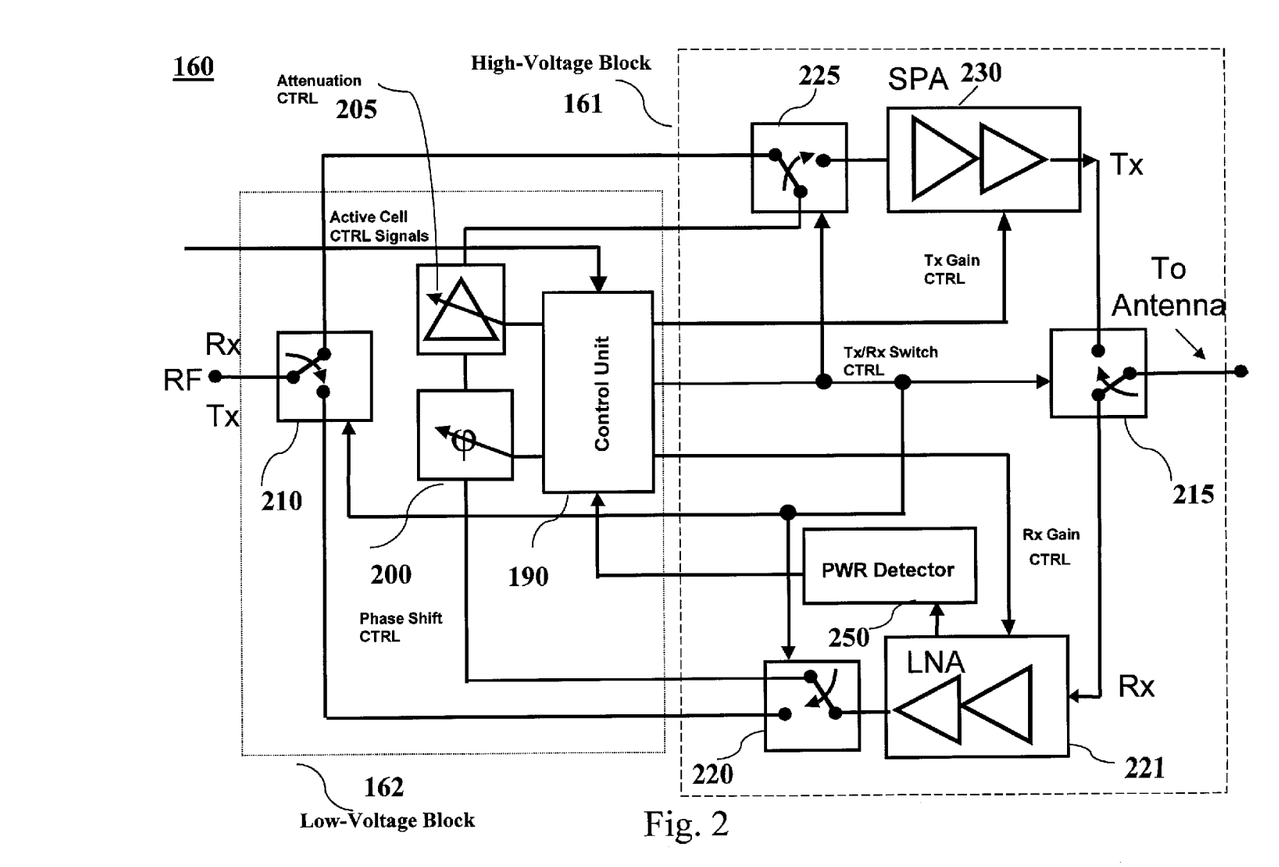
FIG. 2 is a schematic illustration of an RF beamforming interface circuit for the array of FIG. 1 having a high voltage substrate and a low voltage substrate.

A circuit diagram for an exemplary embodiment of RF beamforming interface circuit 160 is shown in FIG. 2. Note that the beamforming performed by beamforming circuits 160 may be performed using either phase shifting, amplitude variation, or a combination of both phase shifting and amplitude variation. Accordingly, RF beamforming interface circuit 160 is shown including both a variable phase shifter 200 and a variable attenuator 205. It will be appreciated, however, that the inclusion of either phase shifter 200 or attenuator 205 will depend upon the type of beamforming being performed. To provide a compact design, RF beamforming circuit may include RF switches/multiplexers 210, 215, 220, and 225 so that phase shifter 200 and attenuator 205 may be used in either a receive configuration or a transmit configuration. For example, in a receive configuration RF switch 215 routes the received RF signal to a low noise amplifier 221. The resulting amplified signal is then routed by switch 220 to phase shifter 200 and/or attenuator 205. The phase shifting and/or attenuation provided by phase shifter 200 and attenuator 205 are under the control of controller/phase manager circuit 190. The phase shifted signal routes through RF switch 225 to RF switch 210. RF switch 210 then routes the signal to IF processing circuitry through the transmission network (not illustrated).

In a transmit configuration, the RF signal received from IF processing circuitry (alternatively, a direct down-conversion architecture may be used to provide the RF signal) routes through RF switch 210 to RF switch 220, which in turn routes the RF signal to phase shifter 200 and/or attenuator 205. The resulting shifted signal is then routed through RF switch 225 to a power amplifier 230. The amplified RF signal then routes through RF switch 215 to antenna 170 (FIG. 1). It will be appreciated, however, that different configurations of switches may be implemented to provide this use of a single set of phase-shifter 200 and/or attenuator 205 in both the receive and transmit configuration. In addition, alternate embodiments of RF beamforming interface circuit 160 may be constructed not including switches 210, 220, and 225 such that the receive and transmit paths do not share phase shifter 200 and/or attenuator 205. In such embodiments, RF beamforming interface circuit 160 would include separate phase-shifters and/or attenuators for the receive path and transmit path. Any suitable phase-shifter may be used. For example, U.S. patent application Ser. No. 11/535,928, filed Sep. 27, 2006, the contents of which are incorporated by reference discloses a particularly advantageous analog phase shifter that may be incorporated into the high power WSAM disclosed herein.

As disclosed in U.S. application Ser. No. 11/536,625, a particularly advantageous transmission network with regard to an integrated circuit or a wafer scale architecture is a coplanar waveguide (CPW) network. Although the scope of the invention includes the use of any suitable architecture for a transmission network such as CPW, microstrip, and planar waveguide, CPW enjoys superior shielding properties over microstrip. Thus, the following discussion will assume without loss of generality that the transmission network is implemented using CPW. This network may be arranged in an "H" array such that the electrical length from an RF input port to any given integrated antenna circuit is the same as that to all the remaining integrated antenna circuits. Although CPW has superior shielding properties, the RF propagation across a CPW network on a semiconductor wafer such as an 8" wafer may introduce losses as high as 120 dB. But as discussed in U.S. application Ser. No. 11/536,625, the plurality of distributed amplifiers associated with the CPW network not only overcomes these transmission losses but also provides gain to the transmitted signal as it propagates through the CPW network.

Although the resulting transmission network advantageously overcomes its propagation losses, it will introduce substantial dispersion to high frequency RF signals and pulses. As discussed in U.S. application Ser. No. 11/536,625, a resonant transmission network may be used to avoid this propagation dispersion. Instead of propagating an RF signal from an input port through the transmission network to the antennas, an RF triggering signal is injected into the input port. The transmission network and its distributed amplifiers are tuned so as to be resonant at the triggering signal frequency. Thus, the entire network resonates in unison, thereby leading advantageously to a global synchronization at all the antennas without the dispersion encountered in the linear amplification embodiments. Accordingly, without loss of generality, the following discussion will assume that the transmission network is a resonant CPW network.

Figure 3:
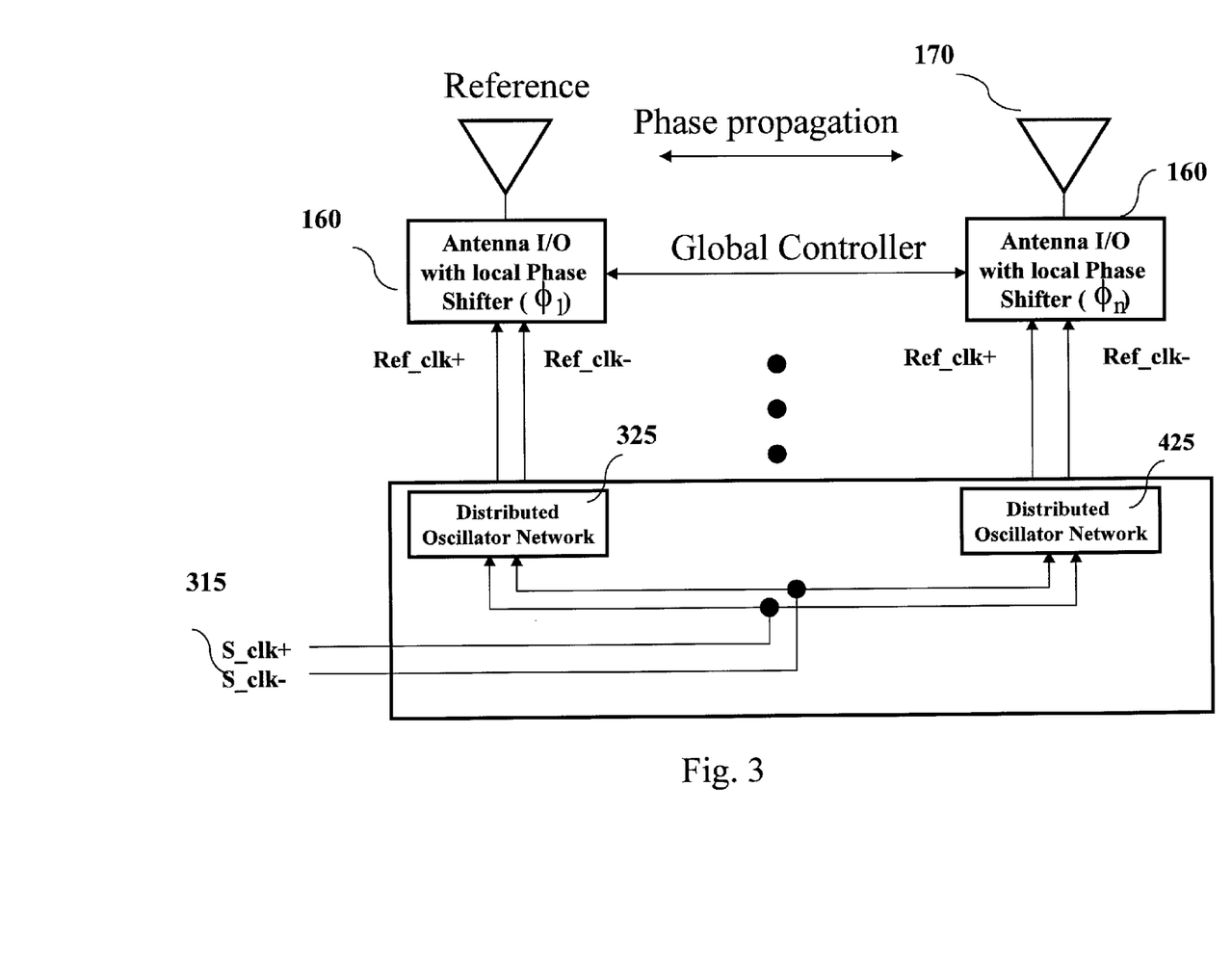
FIG. 3 is an illustration of a resonant transmitting network driving a plurality of RF beamforming circuits and corresponding antennas.

Turning now to FIG. 3, a resonant distributed oscillator network 325 couples to a plurality of RF beamforming units 160 and associated antennas 170. In this embodiment, network 225 is a differential network and thus is triggered by a differential triggering signal 315. In response, the resonant network then globally oscillates in that the voltage across the entire network raises and falls in unison. Advantageously, such a global oscillation means that the differential network voltage (represented as Ref_clk+ and Ref_clk−) is globally synchronized at each of the RF beamforming units 160. It will be appreciated that a single-ended network could also be implemented. Regardless of whether the resonant oscillation is single-ended or double-ended, each beam-forming unit 160 can act to independently phase-shift the globally-synchronized signal it receives from the resonant network. A global controller provides the appropriate commands to the beamforming units such that each beam-forming unit provides a unique phase-shift to both received and transmitted RF signals from antennas 170.

By performing the beamforming directly in the RF domain as shown with respect to FIGS. 1 and 2, substantial savings are introduced over a system that performs its beamforming in the IF or baseband domain. Such IF or baseband systems must include A/D converters for each RF channel being processed. In contrast, the system shown in FIG. 1 may supply a combined RF signal from adder 105. From an IF standpoint, it is just processing a single RF channel for the system of FIG. 1, thereby requiring just a single A/D. Accordingly, the following discussion will assume that the beamforming is performed in the RF domain. The injection of control signals into each beam-forming unit 160 may be performed inductively as discussed in commonly-assigned U.S. Pat. No. 6,885,344, the contents of which are incorporated by reference.

Figure 4:
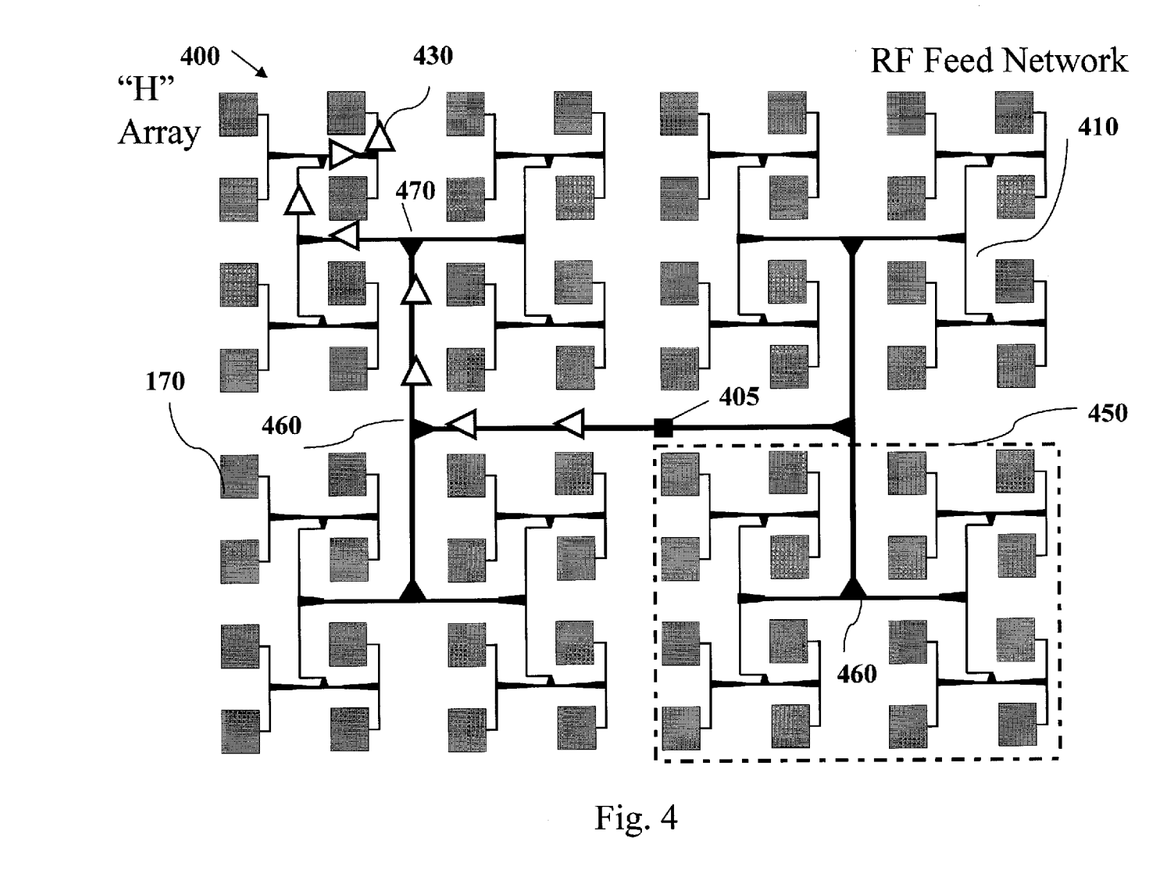
FIG. 4 is a plan view of a wafer scale antenna module having a transmission network supporting resonant oscillation through a plurality of distributed amplifiers, the transmission network being implemented on a low voltage substrate bonded to a high voltage substrate supporting a plurality of antennas.

Turning now to FIG. 4, a resonant half-duplex CPW transmission network 410 is implemented in an 8" wafer scale antenna module 400 coupled to 64 antenna elements 170. Because of the global synchronization provided by the resonant operation of network 410, it may also be denoted as a central clock distribution network. The triggering signal to trigger the resonant oscillation is injected into a center feed point 405. Distributed amplifiers 430 coupled to the network then injection lock to each other such that each antenna 170 may receive a globally synchronized RF signal. In contrast to the resonant transmission network, a half-duplex receiving CPW network (not illustrated) for wafer scale antenna module 400 operates in the linear amplification regime as described for the distributed amplification architecture disclosed in U.S. patent application Ser. No. 11/454,915. For illustration clarity, only a subset of the distributed amplifiers is shown in network 410.

Each transmission network may be single-ended or differential. In one embodiment, each network may comprise a coplanar waveguide (CPW) having a conductor width of a few microns (e.g., 4 microns). With such a small width or pitch to the network, a first array of 64 antenna elements and a second array of 1024 antenna elements may be readily networked in an 8 inch wafer substrate for 10 GHz and 40 GHz operation, respectively. Alternatively, a wafer scale antenna module may be dedicated to a single frequency band of operation.

Figure 5:
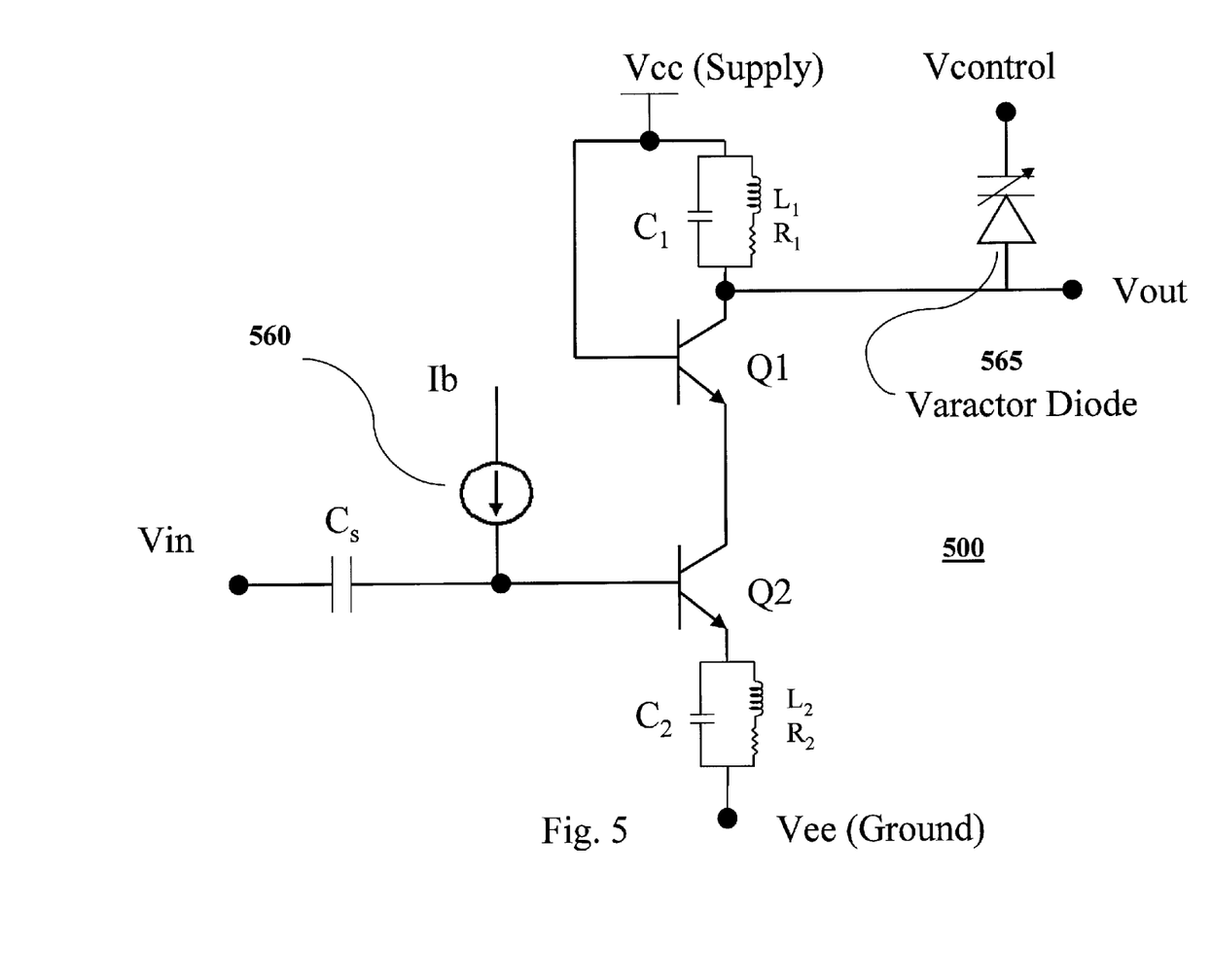
FIG. 5 is a schematic illustration of an embodiment for a distributed amplifier.

The design of the distributed amplifiers is not critical so long as they provide sufficient amplification and achieve a resonant operation with the transmission network. An exemplary distributed amplifier 500 is illustrated in FIG. 5. Driving amplifier uses bipolar transistors Q1 and Q2 although it will be appreciated that an analogous FET-based driving amplifier may also be implemented. The emitter of transistor Q1 couples to the collector of transistor Q2. The collector of Q1 couples to an output voltage node Vout and also to an inductor L1. Inductor L1 may be implemented using the metal layers in the semiconductor process used to form driving amplifier 500 as discussed in U.S. Pat. No. 6,963,307, the contents of which are incorporated by reference. The parasitic capacitance and resistance of inductor L1 are illustrated conceptually as resistor R1 and capacitor C1. An opposing terminal of inductor L1 couples to a supply voltage node Vcc that also couples to the base of transistor Q1. An input voltage node Vin couples through a capacitor Cs to the base of transistor Q2. The base of transistor Q2 is biased by a current source 560 that provides a base current Ib. In a FET-based embodiment, current source 560 would be replaced by a voltage source. Each bipolar transistor would be replaced by a FET transistor of the appropriate doping. For example, NPN transistors such as Q1 and Q2 would be replaced by corresponding n-channel FETs. It will be appreciated that distributed amplifier 500 may also be constructed using PNP bipolar transistors or corresponding p-channel transistors (in a FET-based embodiment). Such dual embodiments (bipolar NPN or PNP, n-channel FET or p-channel FET) may be constructed for all the distributed amplifiers disclosed herein. The emitter of transistor Q2 is optionally loaded by an inductor L2, whose parasitic capacitance and resistance are also conceptually illustrated by a resistor R2 and a capacitor C2. Capacitor Cs and inductor L2 may be formed using semiconductor process metal layers as discussed for inductor L1. The values of the various inductances and capacitances depend upon the impedance of the corresponding resonant transmission network, the dimensions of the transistors, and the operating frequency. For example, in a FET-based embodiment having transistor channel dimensions of 2 microns by 0.12 micron, Cs may have a capacitance of 80 fF, L1 may have an inductance of 80-100 pH (for 40 or 60 GHz operation, respectively), and L2 may have an inductance approximately $\frac{1}{10}^{th}$ that of L1. As discussed analogously in, for example, U.S. application Ser. No. 11/536,625, each distributed amplifier is integrated onto the semiconductor substrate (or semiconductor wafer) that supports the resonant integrated network. Similarly, the beam-forming units are also integrated onto the substrate. The antennas may be formed in either a "backside" or "frontside" implementation as discussed in U.S. application Ser. No. 11/567,650, filed Dec. 6, 2006, the contents of which are incorporated by reference.

To provide a tuning capability for the resulting resonant oscillation of the resonant transmission network loaded by a plurality of distributed amplifiers 500, the output voltage node Vout is also loaded by an anode of varactor 565. The cathode of varactor 565 couples to a tuning voltage node Vcontrol. Because it can be shown that a resonant frequency $f_0$ for distributed amplifier 500 depends on an overall load capacitance C for driving amplifier 500, which in turn depends also on the varactor capacitance (and also the distributed capacitance of the resonant CPW network), changing the varactor capacitance also changes the resonant frequency. Thus, a control voltage driving the tuning voltage node may be used to tune varactor 565 so as to drive the resonant frequency into a desired bandwidth.

Figure 6A:
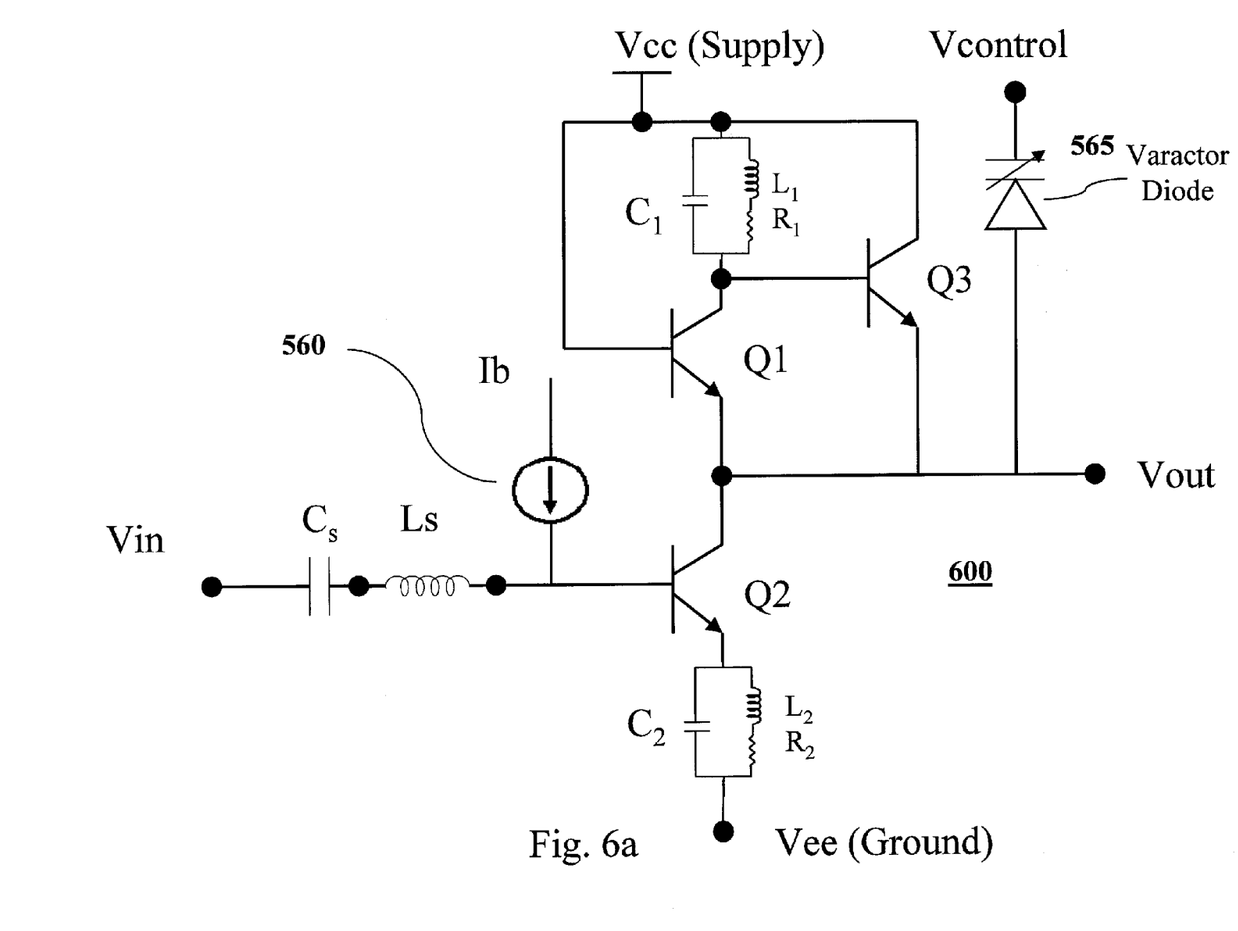
FIG. 6a is a schematic illustration of a distributed amplifier modified to provide enhanced amplitude swing for its output voltage and to provide a robust tuning range.

Although driving amplifier 500 enables a tunable globally synchronized RF signal to be distributed to RF beamforming units 160, there is a limit on the amplitude swing for the resulting oscillation. For example, in some embodiments, it is believed that the resulting resonant oscillation may have a peak-to-peak amplitude swing of just tens of milli-volts. To provide a more robust amplitude swing, an alternative distributed amplifier 600 may be used to drive a resonant transmission network as illustrated in FIG. 6a. Distributed amplifier 600 is constructed analogously to driving amplifier 500 except that capacitor Cs is in series with an optional input inductor Ls, which may be formed using semiconductor process metal layers as discussed previously. Although input inductor Ls reduces overall gain, it provides greater operating bandwidth. Embodiments of distributed amplifier 500 may also include input inductor Ls. Referring again to FIG. 6a, a third transistor Q3 has its base coupled to the collector of Q1 and emitter coupled to the output voltage node Vout. The collector of Q3 couples to the supply voltage node Vcc. As compared to distributed amplifier 500, it can be shown that the addition of transistor Q3 to distributed amplifier 600 provides a voltage drop of approximately Vcc/2 to the output voltage at node Vout. In addition, the additional gain provided by transistor Q3 helps prevent the saturation of transistors Q1 and Q2. In this fashion, amplitude swing on the resonant oscillation can be increased to values such as 250 millivolts, 500 millivolts, or more depending upon the output frequency. Because the resonant frequency for distributed amplifier 600 will depend upon its load inductance L and load capacitance C, which in turn depend also upon the distributed inductance and capacitance of the resonant transmission line, it is desirable to select a resonant transmission line that has a high natural frequency if higher resonant frequencies are desired. Regardless of the resonant frequency that is achieved, it may be controlled through the varactor capacitance as discussed with regard to distributed amplifier 500.

Figure 6B:
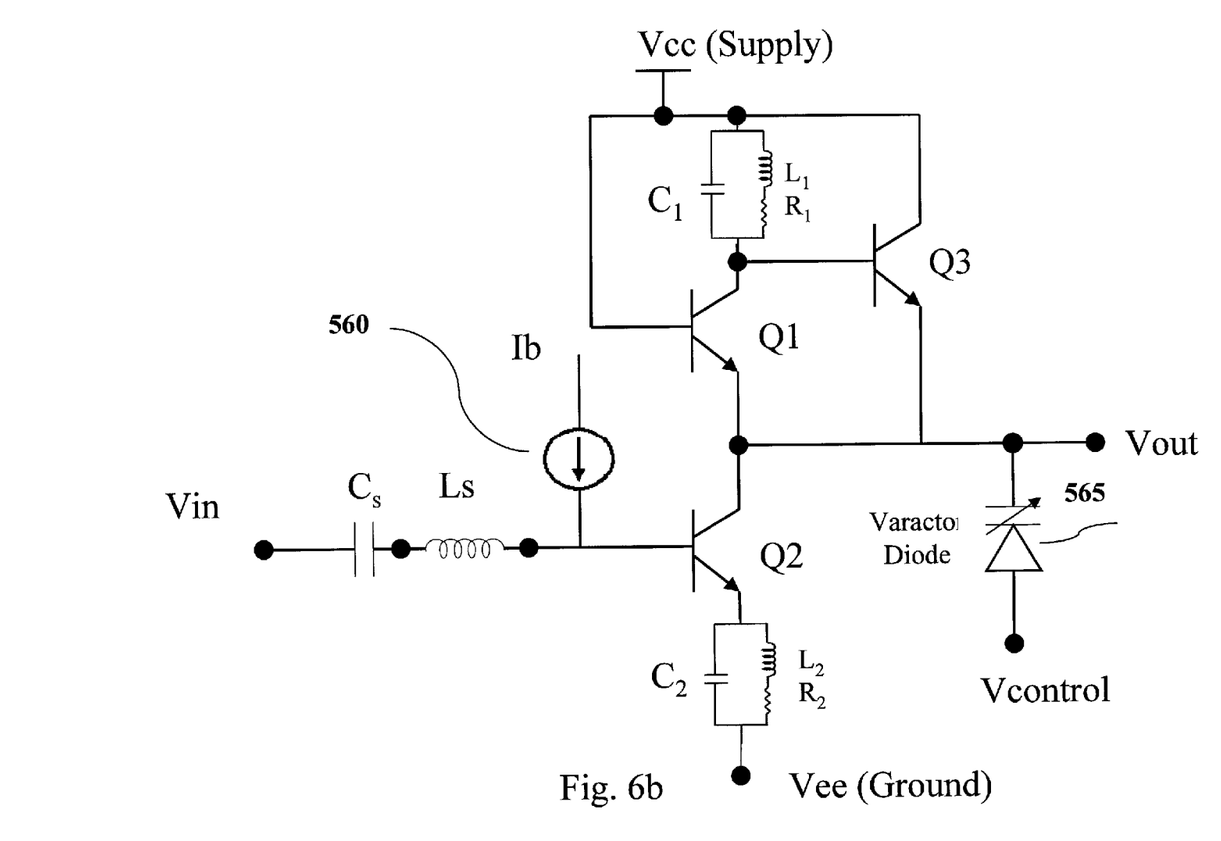

The design of distributed amplifier 600 is advantageous for component density because the same diffusion region that forms the emitter of Q3 also forms the anode for varactor 365. However, it will be appreciated that varactor 365 may also be coupled as shown in FIG. 6b for an alternative embodiment of distributed amplifier 600. As shown in FIG. 6b, the cathode of varactor 365 now couples to the output voltage node. Because the cathode will be oppositely doped as compared to the emitter, separate diffusion regions are used to form the emitter of Q3 and the cathode of varactor 365 in such an embodiment.

The transmission and receiving networks and the integrated circuitry used to form the distributed amplifiers and beamforming units may be formed on a substrate such as silicon, silicon germanium, or silicon on an insulator (SOI) substrate using conventional semiconductor processes such as CMOS or BiCMOS. However, such substrates can support only a certain voltage level. The low-voltage signal limitation on conventional high-speed silicon semiconductor substrates limits the amount of power that may be coupled to any given antenna. To enable high power operation, the antennas and corresponding output power amplifiers may be integrated on a high-voltage (or equivalently, high bandgap) semiconductor substrate such as gallium arsenide, indium phosphide, or gallium nitride as discussed in U.S. application Ser. No. 11/616,235 filed Dec. 26, 2006, the contents of which are incorporated by reference. In a wafer scale embodiment, the resulting wafer scale antenna module would be multi-layered, having a low-voltage semiconductor wafer/substrate (such as silicon germanium or silicon) for supporting the transmission network and a high voltage semiconductor substrate for supporting the transmitter power amplifiers, and also any receiver low-noise amplifiers, any low-resistance and isolated switches, and the antennas.

Referring back to FIG. 2, a low-voltage substrate 162 and a high-voltage substrate 161 are used to form a beamforming unit 160. The active circuitry for the beam shaping and distributed amplification as well as the transmission networks is integrated with low voltage substrate 162. Conversely, the power amplifiers, low noise amplifiers, and antennas are integrated with high voltage substrate 161. To provide efficient high power operation, power amplifier 230 may be implemented as a switch-mode power amplifier (SPA). To better enable efficient switch mode operation, the RF signal that drives SPA 230 may be rectified in a Schmitt trigger or comparator with high gain (not illustrated). In addition, this rectified signal may then be patterned in a pattern generator (not illustrated). For example, the rectified signal may be gated so that antennas 170 transmit RF pulses. In such embodiments, the globally synchronized signal is received, pulse shaped, and then fed to the SPA for very efficient output transmission. The reduced complexity in design of a highly integrated high power transmitter is very suitable for advanced radar applications.

As discussed in U.S. application Ser. No. 11/616,235, the coupling of the RF signal from the low-voltage substrate to the high-voltage substrate may be performed inductively or through an ohmic coupling. However, inductive coupling has a number of advantages as discussed further in U.S. application Ser. No. 11/616,235. Referring back to FIG. 4, it may be seen that the high voltage substrate is illustrated as transparent so that the resonant transmission network and distributed amplifiers may also be shown.

It will be obvious to those skilled in the art that various changes and modifications may be made without departing from this invention in its broader aspects. The appended claims encompass all such changes and modifications as fall within the true spirit and scope of this invention.

I claim:

1. An integrated circuit antenna array, comprising:
   a low-voltage substrate supporting an RF transmission network, and
   a high-voltage substrate bonded to the low-voltage substrate, the high-voltage substrate supporting a plurality of antennas coupled to the RF transmission network through switch-mode power amplifiers integrated into a surface of the high voltage substrate.

2. The integrated circuit antenna array of claim 1, wherein the RF transmission network comprises an RF feed network coupling to a distributed plurality of amplifiers inte-grated with the substrate, wherein the RF feed network and the distributed plurality of amplifiers are configured to form a resonant network such that if a timing signal is injected into an input port of the RF feed network, the resonant network oscillates to provide a globally synchronized RF signal to each of the antennas.

3. The integrated circuit antenna array of claim 2, wherein the low voltage sub-strate comprises silicon and the high voltage substrate is selected from the group consisting of gallium arsenide, indium phosphide, and gallium nitride.

4. The integrated circuit antenna array of claim 2, wherein the RF feed network is implemented using waveguides selected from the group consisting of microstrip waveguides, co-planar waveguides, and planar waveguides.

5. The integrated circuit antenna array of claim 3, wherein the low voltage sub-strate comprises a silicon wafer.

6. The integrated circuit antenna array of claim 2, wherein the resonant network is configured to provide a resonant RF signal having an amplitude swing of at least 250 millivolts.

7. The integrated circuit antenna array of claim 2, wherein the resonant network is configured to provide a resonant RF signal having an amplitude swing of at least 500 millivolts.

* * * * *